(12) United States Patent
Hsu et al.

(10) Patent No.: US 6,462,366 B1
(45) Date of Patent: Oct. 8, 2002

(54) FERROELECTRIC NONVOLATILE TRANSISTOR

(75) Inventors: Sheng Teng Hsu, Camas; Jer-shen Maa, Vancouver; Fengyan Zhang, Vancouver; Tingkai Li, Vancouver, all of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/481,674

(22) Filed: Jan. 12, 2000

Related U.S. Application Data

(62) Division of application No. 09/187,238, filed on Nov. 5, 1998, now Pat. No. 6,048,740.

(51) Int. Cl.$^7$ ............................................. H01L 29/76
(52) U.S. Cl. ........................ 257/295; 257/300; 257/296
(58) Field of Search ................................ 257/295, 256, 257/300, 392, 296, 314, 315, 205–312

(56) References Cited

U.S. PATENT DOCUMENTS

| | | | |
|---|---|---|---|
| 5,384,729 A | * | 1/1995 | Sameshima |
| 5,536,962 A | * | 7/1996 | Pfiester |
| 6,002,150 A | * | 12/1999 | Gardner et al. |
| 6,013,584 A | * | 1/2000 | M'Saad |
| 6,159,781 A | * | 12/2000 | Pan et al. |

OTHER PUBLICATIONS

Pierret, "Field Effect Devices," 1990, Addison–Wesley Publishing Company, vol. 4, pp. 138–139.*

* cited by examiner

Primary Examiner—Nathan J. Flynn
Assistant Examiner—Kevin Quinto
(74) Attorney, Agent, or Firm—David C. Ripma; Matthew D. Rabdau; Scott C. Krieger

(57) ABSTRACT

A method of fabricating a ferroelectric memory transistor using a lithographic process having an alignment tolerance of δ, includes preparing a silicon substrate for construction of a ferroelectric gate unit; implanting boron ions to form a p-well in the substrate; isolating plural device areas on the substrate; forming a FE gate stack surround structure; etching the FE gate stack surround structure to form an opening having a width of L1 to expose the substrate in a gate region; depositing oxide to a thickness of between about 10 nm to 40 nm over the exposed substrate; forming a FE gate stack over the gate region, wherein the FE gate stack has a width of L2, wherein L2≧L1+2δ; depositing a first insulating layer over the structure; implanting arsenic or phosphorous ions to form a source region and a drain region; annealing the structure; depositing a second insulating layer; and metallizing the structure.

A ferroelectric memory transistor includes a silicon substrate having a p-well formed therein; a gate region, a source region and a drain region disposed along the upper surface of said substrate; a FE gate stack surround structure having an opening having a width of L1 located about said gate region; a FE gate stack formed in said FE gate stack surround structure, wherein said FE gate stack has a width of L2, wherein L2≧L1+2δ, wherein δ is the alignment tolerance of the lithographic process.

7 Claims, 5 Drawing Sheets

FERROELECTRIC NONVOLATILE TRANSISTOR

CROSS REFERENCE TO RELATED APPLICATIONS

This application is a divisional of application Ser. No. 09/187,238, filed Nov. 5, 1998, entitled "Ferroelectric Nonvolatile Transistor and Method of Making Same," now U. S. Letters Pat. No. 6,048,740.

FIELD OF THE INVENTION

This invention relates to MOS transistors, and specifically to a MOS memory transistor that incorporates a ferroelectric layer.

BACKGROUND OF THE INVENTION

Prior art single transistor ferroelectric devices may be classified in two types of devices: Metal-Ferroelectric-Metal-Oxide Semiconductor (MFMOS) transistors and Metal-Ferroelectric-Metal-Semiconductor (MFMS) transistors. The structures of such devices are depicted in FIG. 1 and FIG. 2, respectively.

Referring initially to FIG. 1, a MFMOS memory transistor is depicted generally at 10. Transistor 10 is constructed on a silicon substrate 12. The transistor includes a gate region 14, a n+ source region 16, a n+ drain region 18 and a ferroelectric (FE) gate stack 20. Gate stack 20 includes a bottom electrode 22, a FE layer 24, and a top electrode 26. An oxide insulating layer 28 covers the conductive portions of the transistor. The completed transistor includes a source electrode 30, a gate stack electrode 32, and a drain electrode 34. As shown in FIG. 2, a MFMS memory transistor 36 is similarly constructed to transistor 10, but includes an n-layer 38 in gate region 14.

The materials used in the FE stack for the top and bottom electrode in known ferroelectric memory transistors are Pt, Ir, Zr, IrO, ZrO, or alloys containing one or more of the metals. To insure proper operation of the completed device, the gate stack has to be precisely etched to align the sides of the ferroelectric capacitor. Although equipment is available for performing such etching on the metals, the etch, is at best, a sputtering process, which is only partially successful. It is not possible to selectivity etch the metal without damaging the surrounding silicon oxide and silicon to a degree that is acceptable, which requires that gate stack plasma etching consumes the surrounding silicon and oxide in amounts less than several tens of nanometer. Any consumption greater than this amount will degrade or destroy the normal operation of the memory transistor.

SUMMARY OF THE INVENTION

A method of fabricating a ferroelectric memory transistor using a lithographic process having an alignment tolerance of, includes preparing a silicon substrate for construction of a ferroelectric gate unit; implanting boron ions to form a p-well in the substrate; isolating plural device areas on the substrate; forming a FE gate stack surround structure; etching the FE gate stack surround structure to form an opening having a width of L1 to expose the substrate in a gate region; oxide is deposited by CVD to a thickness of between about 10 nm to 40 nm over the exposed substrate; forming a FE gate stack over the gate region, wherein the FE gate stack has a width of L2, wherein $L2 \geq L1+2\delta$; depositing a first insulating layer over the structure; implanting arsenic or phosphorous ions to form a source region and a drain region; annealing the structure; depositing, by CVD, a second insulating layer; and metallizing the structure.

A ferroelectric memory transistor includes a silicon substrate having a p-well formed therein; a gate region, a source region and a drain region disposed along the upper surface of said substrate; a FE gate stack surround structure having an opening having a width of L1 located about said gate region; a FE gate stack formed in said FE gate stack surround structure, wherein said FE gate stack has a width of L2, wherein $L2 \geq L1 + 2\delta$, wherein $\delta$ is the alignment tolerance of the lithographic process.

An object of the invention is to improve the manufacturing yield of ferroelectric memory transistors.

DETAILED DESCRIPTION OF THE PREFEREED EMBODIMENT

Figure 1:
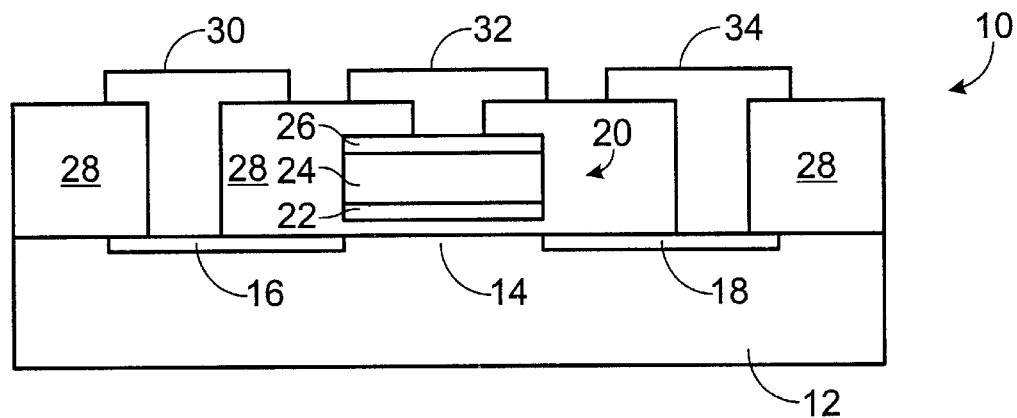
FIG. 1 depicts a prior art MFMOS memory transistor.
Figure 2:
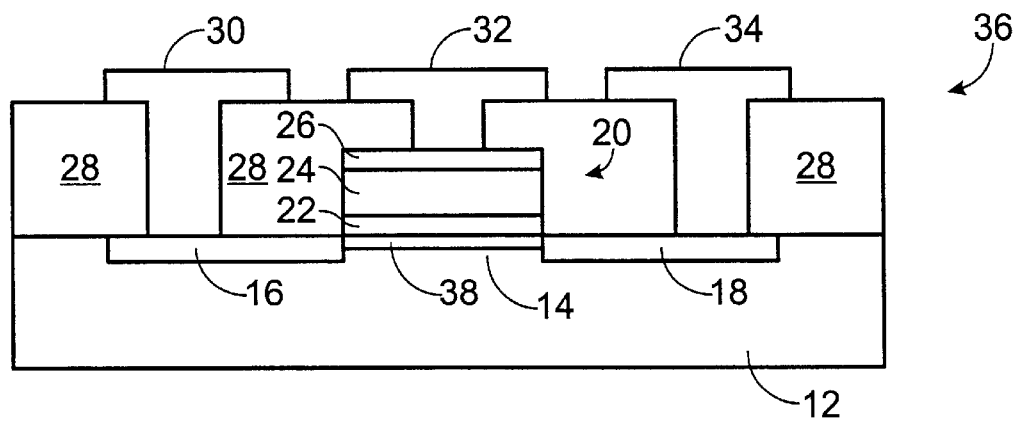
FIG. 2 depicts a prior art MFMS memory transistor.
Figure 3:
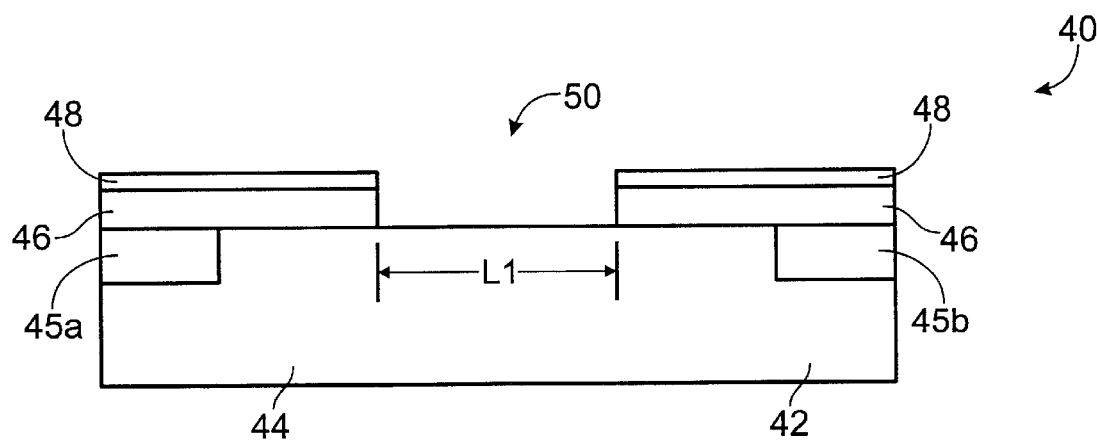
FIGS. 3–5 depict successive steps in the manufacture of a MFMOS memory transistor constructed according to the invention.

Referring now to FIG. 3, the method for fabricating MFMOS memory transistor 40 according to the invention will be described. Plural devices constructed according to the invention are formed on a silicon wafer, which may either a separation by implantation of oxygen (SIMOX) substrate, or a bulk silicon substrate 42. The first step in the manufacturing process is to form the device areas for plural structures by isolating portions of the wafer from adjoining device areas. This may be done by trenching or by implantation of insulating materials.

The next step is n-well or p-well formation in the device areas. In the example provided herein, a p-well 44 is formed in substrate 42 by implantation of boron ions, preferably at an energy level of 30 keV to 180 keV, and a concentration of $5.0 \times 10^{11}$ cm$^{-2}$ to $5.0 \times 10^{13}$ cm$^{-2}$. Oxide regions 45a, 45b are formed in the substrate to provide further device isolation. The threshold voltage is adjusted by implantation of $BF_2$ ions, at an energy level of 10 keV to 50 keV, and a concentration of $1.0 \times 10^{12}$ cm$^{-2}$ to $1.0 \times 10^{13}$ cm$^{-2}$.

Still referring to FIG. 3, a phosphorous silicate glass (PSG) layer 46 is deposited to a thickness of between 100 nm to 300 nm, at a temperature of between 300° C. to 500° C. A silicon oxide cap 48, having a thickness of between 20 nm to 50 nm is deposited over the PSG. The combination of the PSG layer and the silicon oxide cap is referred to herein as a FE gate stack surround structure, for reasons which will become apparent later herein. One technique for depositing the PSG is to introduce $PH_3$ gas into a gas stream during an oxide deposition process. The phosphorous will take the form of phosphorous pentoxide ($P_2O_5$), also know as binary glass. The PSG provides an additional moisture barrier between the structure and the substrate, it attracts and hold mobile ionic contaminants, i.e., gettering, to keep the contaminants from migrating to the surface of the structure, and provides increased flow characteristics.

The structure is coated with photoresist, and the PSG at the gate region is plasma etched to form an opening 50 in the FE gate stack surround structure having a width L1. The etching process is stopped before the underlying silicon is removed. The photoresist is then removed, resulting in the structure as shown in FIG. 3.

A layer of low-temperature oxide 52 is deposited by CVD to a thickness of between 10 nm to 40 nm. This layer is plasma etched to the level of the silicon substrate. The structure is wet cleaned, and the silicon is etched just enough to remove any silicon damaged during the plasma etch process.

The exposed gate region is oxidized by exposure to an oxygen atmosphere during heating to a temperature of between 700° C. to 900° C. Two portions of PSG layer 46 and oxide cap 48 remain on substrate 42. Oxide layers 52 and the remaining portions of oxide cap 48 merge into a single oxide layer 52.

Figure 4:
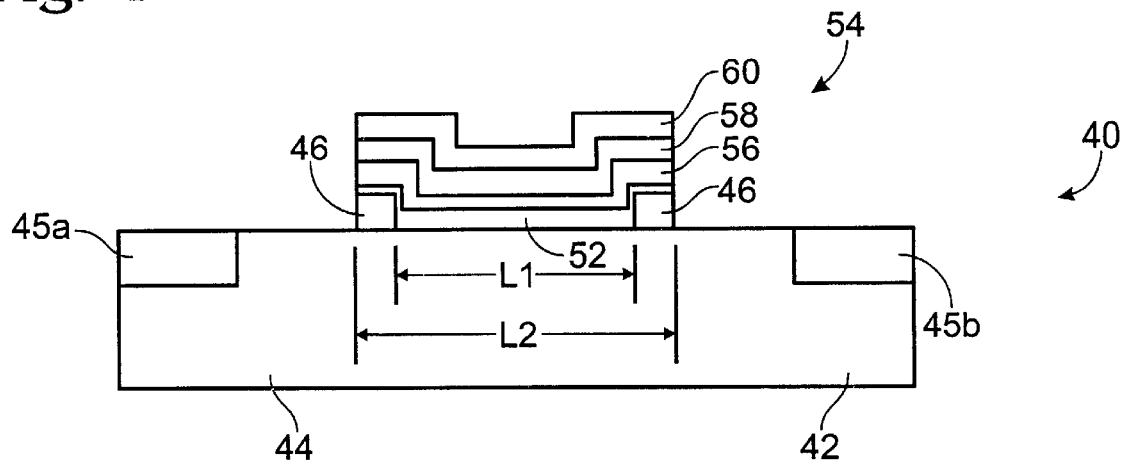

At this point, formation of the ferroelectric gate unit may begin. Referring now to FIG. 4, a FE gate stack is identified generally at 54, and includes a bottom electrode 56, the ferroelectric (FE) material 58 and a top electrode 60. The construction of FE gate stack 54 begins with the deposition of the bottom electrode on oxide layer 52. Bottom electrode 56 may be formed of Pt or Ir, an alloy of Pt/Ir, or other suitable conductive material. The thickness of this metal is 20 nm to 100 nm.

Next, FE material 58 is deposited by chemical vapor deposition (CVD). The FE material may be any of the following: $Pb(Zr, Ti)O_3$ (PZT), PLZT, $SrBi_2Ta_2O_9$ (SBT), $Pb_5Ge_3O_{11}$, $BaTiO_3$ or $LiNbO_3$, The preferred compounds are, in order of preference, $Pb_5Ge_3O_{11}$, SBT and PZT. Most of the experimental work in the FE gate unit field has been done on PZT compounds. FE material 58 is deposited to a thickness of 100 nm to 400 nm.

The top electrode 60 is then formed over the FE material. The top electrode may be formed of the same materials as the bottom electrode, to a thickness of 20 nm to 200 nm.

The structure is coated with photoresist. Ferroelectric gate stack 54, along with underlying PSG 46 and oxide 52, is plasma etched, to the level of silicon substrate 42. The width of the ferroelectric stack is L2, where $L2 \geq L1+2\delta$, and $\delta$ is the alignment tolerance of the lithographic process.

Figure 5:
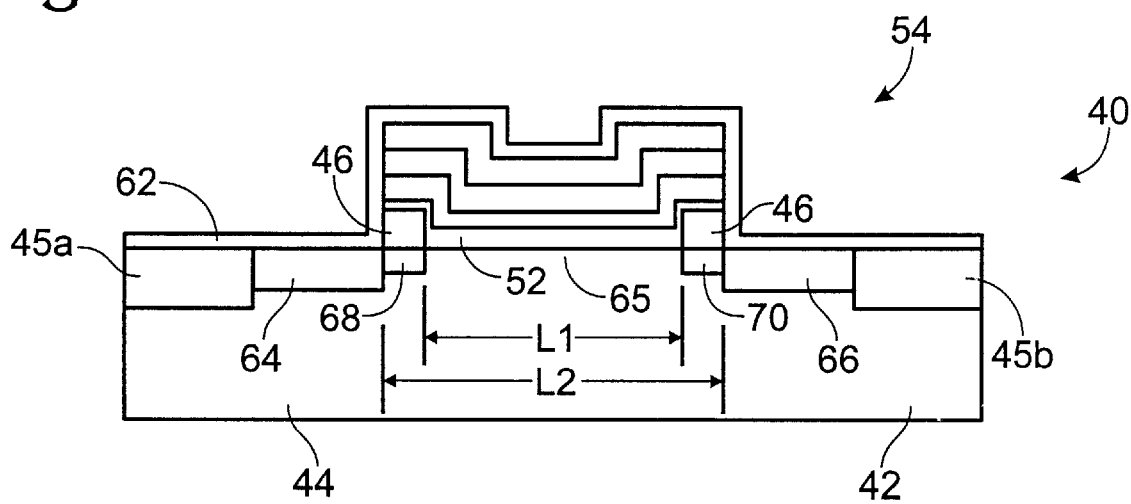

Referring now to FIG. 5, $TiO_2$ or silicon nitride is deposited to a thickness of between 10 nm to 50 nm to form a first insulating layer 62. The structure is implanted with arsenic ions at an energy of between 30 keV to 80 keV and a concentration of $1.0 \times 10^{15}$ cm$^{-2}$ to $1.0 \times 10^{16}$ cm$^{-2}$ to form a n+ source region 64 and a n+ drain region 66. The structure is annealed at a temperature of between 600° C. to 1,000° C. for between about 10 minutes to 60 minutes. During the annealing process, phosphorus diffuses from PSG to the silicon substrate to form lightly doped source region 68 and lightly doped drain region 70, resulting in the structure depicted in FIG. 5.

Figure 6:
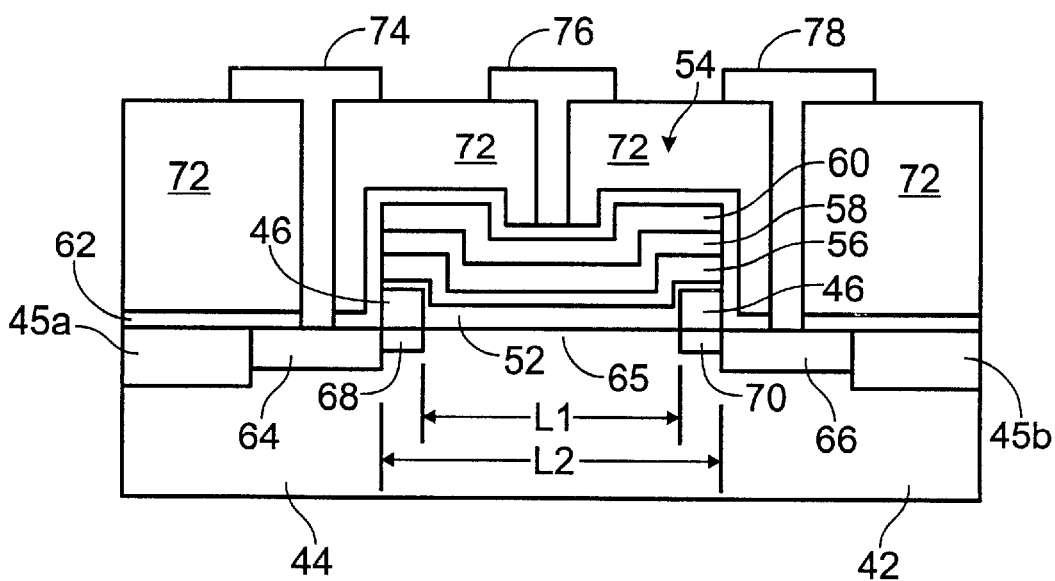
FIG. 6 depicts a completed MFMOS memory transistor constructed according to the invention.

A passivation oxide, or second insulating, layer 72 is deposited by CVD. The structure is coated with photoresist and contact etched to form areas to receive the electrodes for the transistor. The structure is then metallized to form a source electrode 74, a gate electrode 76 and a drain electrode 78, resulting in the competed structure shown in FIG. 6.

Figure 7:
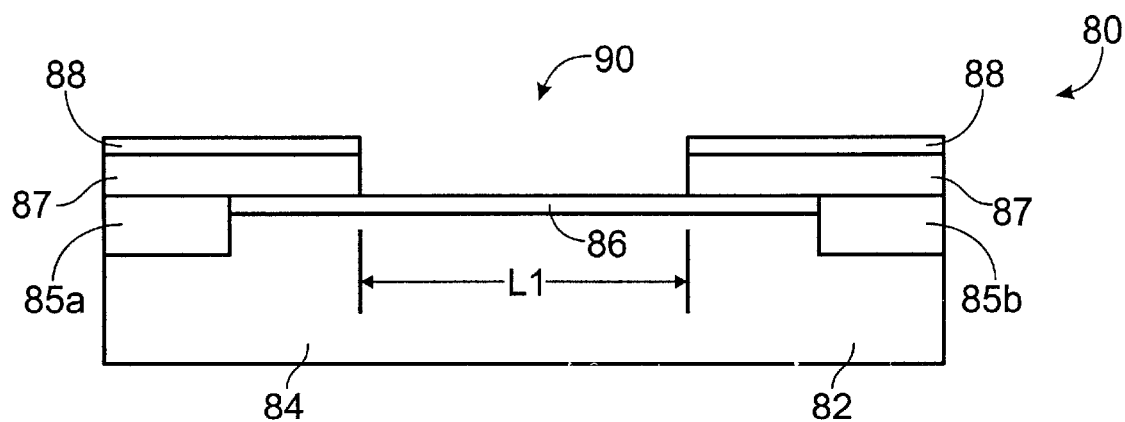
FIGS. 7–9 depict successive steps in the manufacture of a MFMS memory transistor constructed according to the invention.

For MFMS memory transistors the process is similar to that of MFMOS memory transistor. Referring now to FIG. 7, the process from constructing a MFMS memory transistor 80 will be described.

As in the case of MFMOS memory transistor 40, plural devices constructed according to the invention are formed on a silicon wafer, which may either a separation by implantation of oxygen (SIMOX) substrate, or a bulk silicon substrate 82. The first step in the manufacturing process is to form the device areas for plural structures by isolating portions of the wafer from adjoining device areas. This may be done by trenching or by implantation of insulating materials.

The next step is n-well or p-well formation in the device areas. In the example provided herein, a p-well 84 is formed in substrate 82 by implantation of boron ions, preferably at an energy level of 30 keV to 180 keV, and a concentration of $5.0 \times 10^{11}$ cm$^{-2}$ to $5.0 \times 10^{13}$ cm$^{-2}$. Oxide regions 85a, 85b are formed in the substrate to provide further device isolation.

The next step includes implantation of phosphorous ions, preferably at an energy level of 5 keV to 40 keV, and a concentration of $5.0 \times 10^{11}$ cm$^{-2}$ to $1.0 \times 10^{13}$ cm$^{-2}$, to form an n-layer 86 in the top 20 nm to 100 nm of silicon substrate 82. Here, the process differs from that used to form MFMOS memory transistor 40. Another difference in the formation of a MFMS transistor is that the PSG layer may be used, but is not necessary. The description of this embodiment includes the use of the PSG layer, however, its use may be omitted, and may be replaced with oxide only. A phosphorous silicate glass (PSG) layer 87 is deposited to a thickness of between 100 nm to 300 nm, at a temperature of between 300° C. to 500° C. A silicon oxide cap 88, having a thickness of between 20 nm to 50 nm is deposited over the PSG. The combination of the PSG layer and the silicon oxide cap is referred to herein as a FE gate stack surround structure. Alternately, a layer of low-temperature oxide may be deposited by CVD to a thickness of 100 nm to 300 nm in place of the PSG and oxide cap, over n-layer 86, which n-and oxide layers function as the FE gate stack surround structure.

The structure is coated with photoresist, and the oxide at the gate region is plasma etched to form an opening 90 in the FE gate stack surround structure having a width L1. The etching process is stopped before the underlying silicon is removed. The photoresist is then removed, resulting in the structure as shown in FIG. 7.

A layer of low-temperature oxide is deposited by CVD to a thickness of between 10 nm to 40 nm, joining with oxide cap 88. This layer is plasma etched to the level of the silicon substrate. The structure is wet cleaned, and the silicon is etched just enough to remove any silicon damaged during the plasma etch process.

Figure 8:
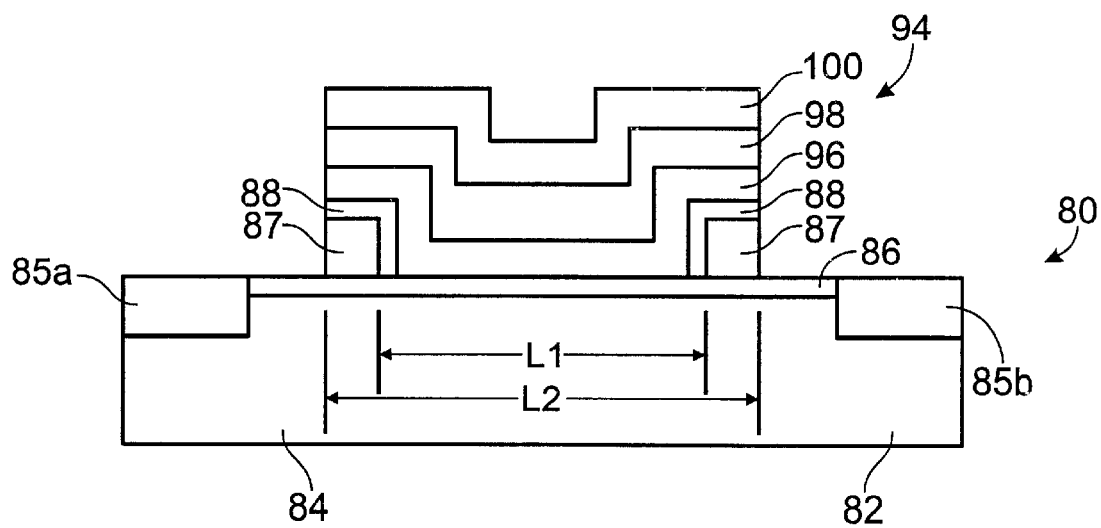

At this point, formation of the ferroelectric gate unit may begin. Referring now to FIG. 8, a FE gate stack is identified generally at 94, and includes a bottom electrode 96, the ferroelectric (FE) material 98 and a top electrode 100. The construction of FE gate stack 94 is the same as previously described.

The structure is coated with photoresist. Ferroelectric gate stack 94, along with underlying oxide 92, is plasma etched, to the level of silicon substrate 82. The width of the ferroelectric stack is L2, where $L2 \geq L1+2\delta$, and $\delta$ is the alignment tolerance of the lithographic process.

Figure 9:
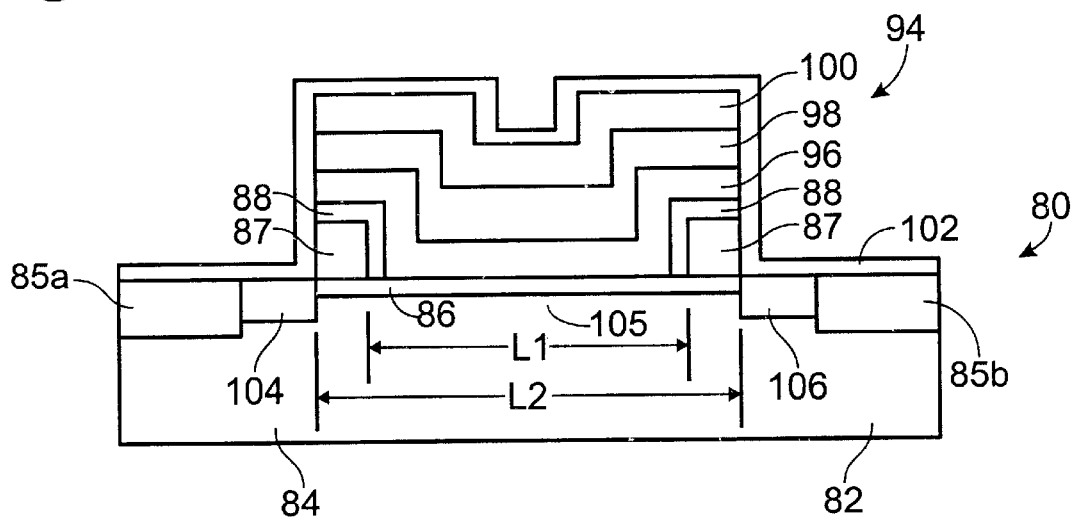

Referring now to FIG. 9, $TiO_2$ or silicon nitride is deposited to a thickness of between 10 nm to 50 nm to form a first insulating layer 102. The structure is implanted with arsenic ions at an energy of between 30 keV to 80 keV and a concentration of $1.0 \times 10^{15}$ cm$^{-2}$ to $1.0 \times 10^{16}$ cm$^{-2}$ to form a n+ source region 104 and a n+ drain region 106. The structure, with a PSG layer, is annealed at a temperature of between 600° C. to 1,000° C., for between 10 minutes and 60 minutes, resulting in the structure depicted in FIG. 9. If the structure is formed without the PSG layer, the structure is annealed at a temperature of between 500° C. to 700° C., for between 20 minutes and 100 minutes.

Figure 10:
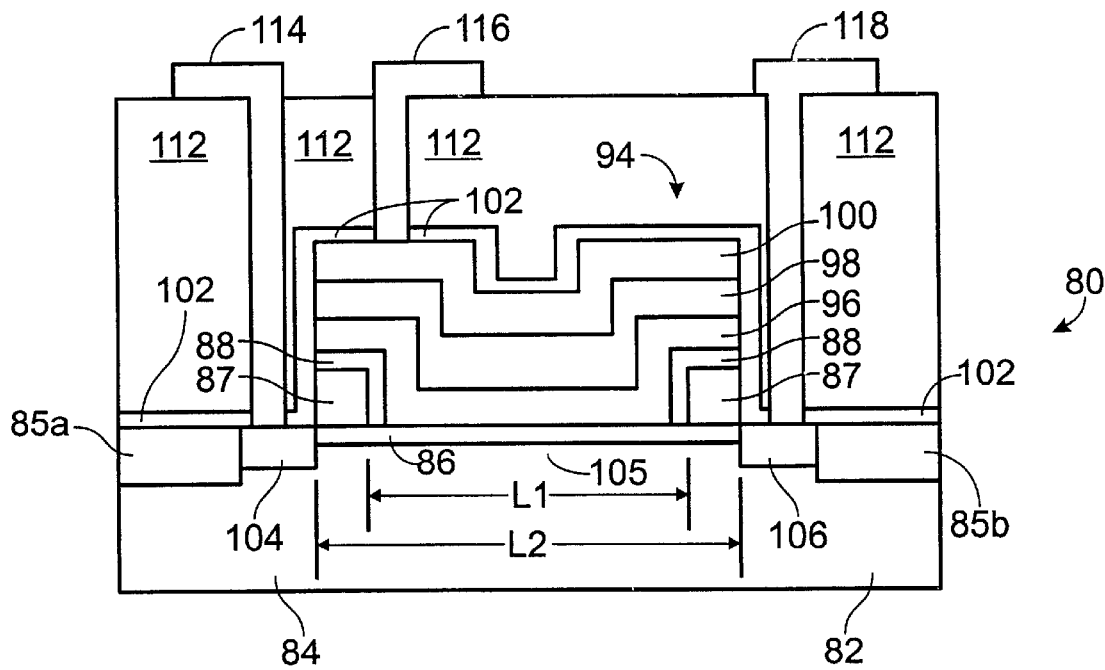
FIG. 10 depicts a completed MFMS memory transistor constructed according to the invention.

A passivation oxide, or second insulating, layer 112 is deposited by CVD. The structure is coated with photoresist and contact etched to form areas to receive the electrodes for the transistor. The structure is then metallized to form a source electrode 114, a gate electrode 116 and a drain electrode 118, resulting in the competed structure shown in FIG. 10.

Although a preferred embodiment of the invention, and a variation thereof, has been disclosed, it should be appreciated that further variations and modifications may be made thereto within the scope of the appended claims.

We claim:

1. A ferroelectric memory transistor comprising:

a silicon substrate having a p-well formed therein;

a gate region, a source region and a drain region disposed along the upper surface of said substrate;

a FE gate stack surround structure formed of PSG having an opening having a width of L1 located about said gate region, wherein said source and drain regions are disposed outside said FE gate surround structure;

lightly doped source and drain regions disposed along the upper surface of said substrate beneath said FE gate stack surround structure between said gate region and said source and drain regions, said lightly doped source and drain regions including phosphorus diffused into the silicon substrate from the PSG of the FE gate stack surround structure;

a FE gate stack formed in said FE gate stack surround structure, wherein said FE gate stack has a width of L2, wherein L2≧L1+2δ, wherein δ is the alignment tolerance of the lithographic process;

a first insulating layer formed over the FE gate stack and the substrate; and a source electrode electrically connected to said source region; a gate electrode electrically connected to said FE gate stack; and a drain electrode electrically connected to said drain region.

2. The transistor of claim 1 wherein said FE gate stack surround structure includes a PSG layer having a thickness of between about 100 nm to 300 nm located on said substrate and an oxide cap overlaying said PSG layer and having a thickness of between about 20 nm to 50 nm.

3. The transistor of claim 2 further includes a lightly doped source region located between said source region and said gate region and a lightly doped drain region located between said drain region and a gate region.

4. The transistor of claim 1 wherein said FE gate stack surround structure includes an n-layer in the top 20 nm to 100 nm of the silicon substrate.

5. The transistor of claim 1 wherein said FE gate stack includes a bottom electrode having a thickness of between about 10 nm to 40 nm, a ferroelectirc layer having a thickness of between about 100 nm to 400 nm, and a top electrode having a thickness of between about 10 nm to 40 nm.

6. The transistor of claim 5 wherein said bottom and top electrodes are formed of material taken from the group consisting of Pt, Ir and Pt/Ir alloy.

7. The transistor of claim 5 wherein said the ferroelectric layer is formed of material taken from the group consisting of $Pb(Zr, Ti)O_3$ (PZT), PLZT, $SrBi_2Ta_2O_9$ (SBT), $Pb_5Ge_3O_{11}$, $BaTiO_3$ and $LiNbO_3$.

\* \* \* \* \*